(12) United States Patent
Demiryont

(10) Patent No.: US 6,190,776 B1
(45) Date of Patent: Feb. 20, 2001

(54) HEAT TREATABLE COATED GLASS

(75) Inventor: Hülya Demiryont, Philadelphia, PA (US)

(73) Assignee: Turkiye Sise Cam, Besiketas-Istanbul (TR)

(*) Notice: Under 35 U.S.C. 154(b), the term of this patent shall be extended for 0 days.

(21) Appl. No.: 09/349,305

(22) Filed: Jul. 7, 1999

(51) Int. Cl.[7] .......................... B32B 15/00; B32B 17/06
(52) U.S. Cl. .......................... 428/434; 428/216; 428/432; 428/472; 428/697; 428/698; 428/699; 428/701; 428/702; 359/359; 296/84.1
(58) Field of Search .................... 428/216, 434, 428/472, 432, 697, 699, 701, 702, 698; 359/359; 296/84.1

(56) References Cited

FOREIGN PATENT DOCUMENTS

| 0104870 | * | 4/1984 | (EP) | ............ C03C/17/36 |
|---|---|---|---|---|
| 0 233 003 A1 | | 8/1987 | (EP). | |
| 0 303 109 A2 | | 2/1989 | (EP). | |
| 0 646 551 A1 | | 4/1995 | (EP). | |
| 0 719 876 A2 | | 7/1996 | (EP). | |
| 0 719 876 A3 | | 10/1996 | (EP). | |
| 0 796 825 A2 | | 9/1997 | (EP). | |

* cited by examiner

Primary Examiner—Deborah Jones
Assistant Examiner—Lymarie Miranda
(74) Attorney, Agent, or Firm—Peter D. McDermott; Banner & Witcoff, LTD

(57) ABSTRACT

A heat-treatable coated glass article comprises a substantially transparent substrate with a substantially transparent dual-function coating on a surface of the substrate. The coating provides low emissivity and high anti-solar performance properties. It comprises a first anti-reflection layer of dielectric material, preferably tungsten oxide. An infra-red reflective layer of silver metal and/or copper metal overlies the anti-reflection dielectric layer. A buffer layer, such as a chromium buffer layer, is positioned between the anti-reflection layer and the infra-red reflective layer. Also, optionally, a color control layer may be used, preferably being positioned between the anti-reflection layer and the substrate. A second buffer layer directly overlies the infrared reflective layer. A second anti-reflection layer overlies the second buffer layer. In accordance with a method of manufacturing the coated article, each of the layers of the coating is deposited in turn by D.C. magnetron sputtering in a multi-station sputtering chamber. Passing the transparent substrate through the sputtering chamber a second time to produce a double-layer coating structure is found to provide especially high quality performance characteristics.

15 Claims, 10 Drawing Sheets

HEAT TREATABLE COATED GLASS

INTRODUCTION

The present invention is directed to transparent substrates having multi-layer coatings for thermal insulation properties, as well as to methods of manufacturing such multi-layer coated articles. The invention relates, in particular, to coated, transparent glass substrates which are heat treatable. Certain preferred embodiments are suitable especially for automotive and architectural applications, exhibiting high visible light transmittance and high infra-red (IR) energy reflectance.

BACKGROUND

Coated glazing products having anti-solar properties, that is, low transmittance of to wavelengths in the infra-red range, are known to those skilled in the art. Coatings for glazing products are disclosed, for example, in European patent application 0 646 551 A1 entitled Heat-Treatment Convertible Coated Glass and Method of Converting Same. That document discloses silver coatings comprising a layer Of $Si_3N_4$ over a layer of nickel or nichrome, over a layer of silver, over a second layer of nickel or nichrome, over a second layer Of $Si_3N_4$. Sputtering is disclosed for producing such coating. Sputtered deposition of a multi-layer coating is described, for example, in European Patent Application 0,418,435 to Nalepka. The multi-layer coating of Hayward et al. is said to comprise a layer of sputtered zinc, tin, titanium, indium/tin or bismuth oxide, next a layer of sputtered silver or silver alloy, then a layer sputtered titanium or stainless steel and finally a layer of zinc, tin, titanium, indium/tin or bismuth oxide. Such multi-layer film is said to have excellent visible light transmission while controlling both near infra-red solar energy and far infra-red reflected energy. A temperable coated article is suggested in U.S. Pat. No. 5,552,180 to Finley et al. The coated article of Finley et al. employs a metal-containing film such as titanium nitride which ordinarily oxidizes at the high temperatures encountered during glass tempering, along with an overcoating of a protective layer of a silicon compound and an undercoating with a stabilizing metal-containing layer. In U.S. Pat. No. 3,990,784 to Gelber a multi-layer coating for architectural glass is suggested, comprising first and second metal layers with a dielectric layer disposed between them. Gelber suggests that the transmission properties of the coating can be changed independent of its reflection properties, by varying the thickness of the metal layers while maintaining the ratio of their thicknesses constant.

Similar coatings are disclosed in European Patent Application 97104710.5 published as EP0796 825 A2, wherein a low emissivity sputtered coating employs controlled index of refraction of an undercoat layer of an appropriate dielectric material below a first $Si_3N_4$ layer. Also a layer of silver is used, sandwiched between layers of nichrome. The term "nichrome" is used to designate a layer which includes some combination of nickel and chromium, at least some of which is in its metallic state, although same may be oxidized. In a similar way, the term "silver" means that the layer consists essentially of metallic silver, but may include some other elements in small concentrations that do not adversely affect the performance characteristics of the silver in the system as a whole. Bent or toughened silver coated glass is taught in European Patent Application 87300601.9 published as No. 0233 003. An additional layer of aluminum, titanium, zinc, tantalum or zirconium is used over the silver layer, or both over and under the silver layer. In recent years, the popularity of coated glasses has occasioned numerous attempts to achieve a coated glass article which, prior to heat-treatment, can be coated, and which thereafter, can be heat-treated without adversely changing the characteristics of the coating or the glass itself (i.e., the resulting glass article). One of the reasons for this is, for example, that it can be extremely difficult to achieve a uniform coating on an already bent piece of glass. It is well-known that if a flat glass surface can be coated and thereafter bent, much simpler techniques can be used to get a uniform coating than if the glass has been previously bent. This is true for architectural, automotive, and residential glasses.

Various difficulties have been encountered by those skilled in the art in developing commercially suitable coatings for architectural and automotive glazing. In particular, it has proved difficult to achieve coatings which provide good attenuation of direct solar radiation, that is, good anti-solar properties. There has long been need in the glazing industry for coating systems which can be uniformly deposited, especially by sputtering onto large surface areas with fast deposition rates, low deposition power density, good film quality, including high film durability, bulk or near bulk density, and long shelf life. As used here, large area deposition refers to deposition onto transparent substrates suitable in size for architectural and automotive glazing applications.

It is an object of the present invention to provide coated articles meeting some or all of these industry needs. In particular, it is an object of at least certain preferred embodiments of the invention to provide heat-treatable coated glass articles comprising a substantially transparent glass substrate with a substantially transparent coating on the surface of the substrate, which coating has good transmittance of visible light as well as good anti-solar performance characteristics. In accordance with certain preferred embodiments, it is a further object to provide glazing units incorporating such coated glass. It is an object of at least certain preferred embodiments of the invention to provide heat-treatable coated glass articles comprising a substantially transparent glass substrate with a substantially transparent coating on the surface of the substrate, which coating has medium level of transmittance of visible light as well as extremely high anti-solar performance characteristics. Such coated articles can be used for architectural purposes and automotive applications, e.g., windshields with heat shielding properties, or windshields with defrosting and anti-fogging properties.

It is a further object of the invention to provide methods of manufacturing the aforesaid coated articles. In accordance with preferred embodiments, such manufacturing includes applying a coating in accordance with the invention. Optionally, the methods disclosed here further include the steps of applying an electrically conductive bus bar, if desired, and performing heat treatment of the coated article, e.g., bending or tempering, and also optionally conducting laminating processes.

Additional objects and advantages of the present invention will be readily understood by those skilled in the art given the benefit of the following disclosure of the invention and detailed description of preferred embodiments.

SUMMARY

In accordance with a first aspect of the invention, a heat-treatable, coated glass article of manufacture comprises a substantially transparent substrate with a substantially transparent multi-layer coating on a surface of the glass substrate. The substantially transparent coating comprises a first anti-reflection layer of dielectric material overlying the surface of the substrate. Preferably, the anti-reflection layer is directly on the surface of the substrate. As used here and in the appended claims, any particular layer of the substantially transparent, multi-layer coating is said to be "directly" on or to "directly" overlie the substrate or another layer of the coating if no other layer of the coating is positioned between them. In this regard, any particular layer of the coating may be said to lie directly on another layer of the coating notwithstanding that there may be a slight transition zone between the two layers involving migration of the material of one layer into the other and/or interlayer reaction products different from the primary composition of the layers. A first buffer layer, most preferably a chromium buffer layer, overlies the first anti-reflection layer. Preferably it lies directly on the anti-reflection layer. A chromium buffer layer, as that term is used here, means a layer which is essentially metallic chromium, such as a layer deposited by sputtering from a chromium metal target in an inert atmosphere. It may be in part oxidized, especially in preferred embodiments wherein the chromium buffer layer scavanges oxygen from an adjacent silver or copper metal or silver-copper mixed metal IR reflective layer and/or from anti-reflection layers during a heat treatment step, as further discussed below. An infrared reflective layer of silver metal or copper metal or silver-copper mixed metal directly overlies the first chromium buffer layer. A second chromium buffer layer directly overlies the infrared reflective layer. Finally, a second anti-reflection layer of dielectric material overlies the second buffer layer. Preferably, it directly overlies the second buffer layer. Preferably, the first and second anti-reflection layers of dielectric material are $SnO_2$, in view of the good D.C. magnetron sputter deposition properties of $SnO_2$ and its compatibility with other preferred materials of the film stack coating disclosed here. Other suitable anti-reflective materials for use in the coating include other oxide and nitrade materials, such as, for example, $WO_3$, $TiO_2$, ZnO, BiOx and $Si_3N_4$. Additional suitable anti-reflection layer materials will be apparent to those skilled in the art given the benefit of this disclosure. Similarly, the use of copper, copper-silver, or most preferably silver in the IR reflective layer, especially with the chromium buffer layers sandwiching it, provides highly durable coatings which are heat-treatable and, in fact, even yield improved spectral properties upon undergoing heat-treatment. That is, especially in preferred embodiments, heat treatment of the system with or without the IR reflective layers shows several significant effects. First, optical transmittance of the coated article improves upon heat treatment. There is a temperature threshold to start transparency improvement, around 400° C., to start the oxidation of the buffer layers. Second, electrical resistance reduces upon heat treatment e.g., sheet resistance of 6 Ohm may be reduced to 3 Ohm after heat treatment. This improvement in sheet resistance is believed due to the diminishing of interface scattering at the abrupt Ag—Cr. The degree of interface by forming an extended interface of Ag—CrOx upon heat treatment. Crystalinity degree of the Ag film may also improve upon heat treatment, producing increased conductivity. This effect is achieved at least in preferred embodiments without noticeable degradation in the IR properties of the system. This excellent electrical conductance of the system allows the electrical heating of the coated glass in certain preferred embodiments by conducting an electrical current through the Ag layer. Third, optical transmittance of the system with anti-reflecting oxide layers improves, as does durability as compared with buffer-silver-buffer three-layer system.

Unless the individual instance of usage clearly indicates otherwise, reference herein to heat-treatable glass should be understood to mean glass with a coating according to the present invention, which has not been heat-treated (but which can undergo heat treatment successfully in accordance with the principles disclosed here) or which has not been heat-treated,. The term heat-treated is used to mean glass which has been subjected to a heat-treating process, such as tempering, annealing and/or bending, etc.

It is one advantage of the present invention that the heat-treatable, coated glass articles disclosed here exhibit certain improvements or changes in spectral properties upon undergoing heat-treating (e.g., at temperatures of about 600° C.). Visible light transmittance increases and sheet resistance decreases, and both mechanical stability and environmental stability improve with heat-treating. In a typical embodiment employing a multi-layer coating deposited by D.C. magnetron sputtering on clear soda-lime-silica glass having a glass thickness from 2.2 mm thick for an automotive windshield application to 6 mm thick for common architectural applications, using $SnO_2$ layers about 20 nm to 60 nm thick for the anti-reflection layers, chromium buffer layers about 1 to 4 nm thick, and a silver metal IR reflectance layer 6 nm to 17 nm thick, emissivity may improve, typically, from a value of 0.15 to 0.01, visible transmittance may increase or may reduce, e.g., from a value of about 85% to about 70%, and sheet resistance will improve from about 13 Ohm/sq. to only about 1.5 Ohm/sq., with no haze occurring. Thus, the coated glass disclosed here can be used as different products. Before heat treatment, coated glass in accordance with an embodiment of the invention may have grey-blue color and Tvis of 50% to 70%. After heat-treating, the same glass may have Tvis of about 70% to 85% and be colorless.

In accordance with certain preferred embodiments, such heat-treatable, coated glass is especially well-suited for use in motor vehicle windshield applications with high transmittance, low visible light reflectance and high energy reflectance, wherein a polyvinyl butyryl or other suitable polymer sheet is sandwiched between one coated glass sheet as disclosed here and an uncoated sheet. Certain especially preferred embodiments employing a coating having the above five layer coating structure, wherein the first buffer layer is a chromium buffer layer of 2 nm and the second buffer is a chromium buffer layer of 2.5 nm, and the infrared reflective layer is a silver metal layer 10 nm thick, when the glass of the windshield (in total for both glass sheets) is about 2.2 mm thick soda-lime-silica glass, have visible light transmittance greater than 76%, solar energy transmittance less than 50%, and solar reflectance (IR region) of at least 25%. In such especially preferred windshield embodiments, and in other preferred embodiments of the invention disclosed here, the infrared reflector layer is silver and each of the chromium buffer layers has a thickness which is about 10% to 30% of the thickness of the silver layer after heat treatment. In such especially preferred windshield embodiments, and in other preferred embodiments of the invention disclosed here, the first buffer layer is about 20% thinner than the second buffer layer.

In accordance with certain preferred embodiments, such heat-treatable, bendable, coated glass is especially well-suited for use in architectural applications, especially for round buildings or buildings with cylindrical outside elevators. Certain especially preferred embodiments employing a coating having the above five layer coating structure, wherein the buffer layers are chromium buffer layers of 4 nm for first buffer and 4 nm for the second buffer the infrared reflective layer is silver metal 14 nm thick, and the glass of about 6 mm thick soda-lime-silica glass, have the ratio of visible light transmittance/total solar energy transmittance of about 50/27. This assumes, for example, a 6 mm–12 mm–6 mm two pane configuration, with the coating at the surface No. 2. Such terminology, when used herein, means that a first 6 mm pane in spaced 12 mm from the second 6 mm No. 1; its inside surface is surface No. 2; etc.

In accordance with another aspect, a heat-treatable coated glass article is provided, having a substantially transparent coating, preferably deposited on soda-lime-silica glass by D.C. magnetron sputtering, wherein the coating comprises:

a first anti-reflection layer of dielectric material overlying the glass substrate a first buffer layer overlying the first anti-reflection layer a first infra-red reflective layer of silver metal directly overlying the first buffer layer a second buffer layer directly overlying the infra-red reflective layer a second anti-reflection layer of dielectric material overlying the second buffer layer a third buffer layer overlying the second anti-reflection layer a second infra-red reflective layer of silver metal directly overlying the third buffer layer a fourth buffer layer directly overlying the second infra-red reflective layer a top anti-reflection layer of dielectric material overlying the fourth buffer layer.

In accordance with certain preferred embodiments, such heat-treatable, coated glass is especially well-suited for use in motor vehicle windshield applications, wherein a polyvinyl butyral (PVB) or other suitable polymer sheet is sandwiched between one coated glass sheet as disclosed here and an uncoated sheet. Such preferred embodiments have very low reflectance of visible light and high transmittance of visible light, as well as low total solar energy transmittance and high solar reflectance (IR region). Certain especially preferred embodiments employing a coating having the above nine layer film stack, wherein the buffer layers are chromium buffer layers of 1 nm to 4 nm thickness, the infrared reflective layer is silver metal around 50 nm to 60 nm thick, when the glass of the windshield (in total for both glass sheets laminated with PVB) is about 5.5 mm thick soda-lime-silica glass, have visible light transmittance greater than 75%; total solar energy transmittance less than 50%; and solar reflectance (IR region) of at least 25%. In such especially preferred windshield embodiments, and in other preferred embodiments of the invention disclosed here, each infrared reflector layer is silver and each of the chromium buffer layers has a thickness which is about 10% to 30%, the thickness of the silver layer after heat treatment.

The chromium buffer layers are found to perform a crucial role in rendering the coated glass articles disclosed here durable and effective. Without wishing to be bound by theory, it is currently understood that the chromium buffer layers, although deposited as chromium metal, oxidize to some degree, especially during heat-treatment of the coated glass. The buffer layers oxidize by taking oxygen from adjacent layers, such as $SnO_2$ or other oxide material of an adjacent anti-reflection layer. There is a resulting increase in volume of the chromium buffer layer and corresponding increase in buffer layer density without cracking of the buffer layer. This is highly advantageous, since the buffer layer should be crack-free and void-free following heat treatment to prevent oxygen diffusion through the buffer layer to the silver metal IR reflection layer. Also, the high-density of the buffer layers reduces or eliminates the adverse affects of migration of silver into the buffer layers. Thus, long term durability and performance are achieved in the multi-layer coated, heat-treatable glass articles disclosed here. In preferred motor vehicle windshield embodiments of the present invention, the multi-layer heat-treatable coating is provided on one of the two glass panes which sandwiched between them a PVB sheet. Preferably, the coating is provided on the inside glass pane (i.e., the one facing the exterior pane vehicle passenger compartment rather than the exterior pane), most preferably on the so-called surface No. 2 of the windshield, i.e., on the outside surface of the inside pane (i.e., adjacent the PVB sheet). The two glass panes, one coated and one uncoated, typically are paired and bent together. In accordance with preferred embodiments, special powder to prevent the glass panes sticking together are usually used between the matched panes during such bending process can be eliminated. The multi-layer coating serves to prevent sticking. Moreover, the multi-layer coating in accordance with preferred embodiments is sufficiently durable and though, that it can be placed into contact with the second glass pane during the bending process without causing unacceptable scratching or other degradation of the coating.

In accordance with another aspect of the invention, methods are provided for making the coated article disclosed above. Such methods comprise providing a substantially transparent substrate, typically with appropriate surface preparation steps being performed on the surface to be coated. The multi-layer, anti-solar coating is then formed on the surface of the substrate. The first anti-reflection layer of dielectric material is deposited, followed by the first chromium buffer layer, followed by the silver metal infra-red reflective layer, followed by the second chromium buffer layer, followed by the second anti-reflection layer. In accordance with preferred embodiments, each of the layers of the substantially transparent coating is deposited by sputtering in a series of sputter stations arranged sequentially in a single sputtering chamber through which the transparent substrate passes at constant travel speed. Suitable partitions, such as curtains or the like, separate one sputter station from the next within the sputtering chamber, such that different deposition atmospheres can be employed at different stations. A reactive atmosphere comprising nitrogen or oxygen or both can be used, for example, at a first station to deposit an anti-reflection layer, followed by a non-reactive atmosphere consisting essentially of argon or other suitable inert gas at a subsequent station for depositing the silver metal IR reflection layer.

In accordance with certain highly preferred embodiments of the manufacturing method disclosed here, the substantially transparent coating is deposited by multiple passes, preferably two passes through such multi-station sputtering chamber. If the multi-station sputtering chamber has a sufficient number of cathodes, e.g., at least nine cathode materials mentioned above, this method is especially suitable, for example, for depositing the nine layer coating disclosed above in a single pass. Alternatively, during each of the passes through the sputtering chamber, a multi-layer coating is deposited comprising the aforesaid first anti-reflection layer, first chromium buffer layer, silver metal layer, second buffer layer and second anti-reflection layer. Coatings formed in accordance with such multi-pass methods of the invention are found to have substantially improved coating properties, including especially colour spectral uniformity.

It will be apparent to those skilled in the art in view of the present disclosure, that the present invention is a significant technological advance. Preferred embodiments of the substantially transparent coatings disclosed here have excellent spectral performance characteristics, including excellent transmittance of visible light and advantageously high anti-solar properties, that is, high attenuation levels of direct solar radiation. Employing the above disclosed silver metal infra-red reflective layer, sandwiched between chromium buffer layers, together with the anti-reflection layers results in novel multi-layer coatings which are highly suitable for large area deposition by planar DC magnetron sputtering. Fast deposition rates can be obtained, even employing advantageously low deposition power densities. The resulting coating has high durability, bulk or near bulk density and long shelf life.

Additional features and advantages of the various embodiments of the present invention will be further understood in view of the following detailed description of certain preferred embodiments.

BRIEF DESCRIPTION OF THE DRAWINGS

Various preferred embodiments of the coated article of manufacture and method of manufacture disclosed above are discussed below with reference to the appended drawing in which.

Figure 1:
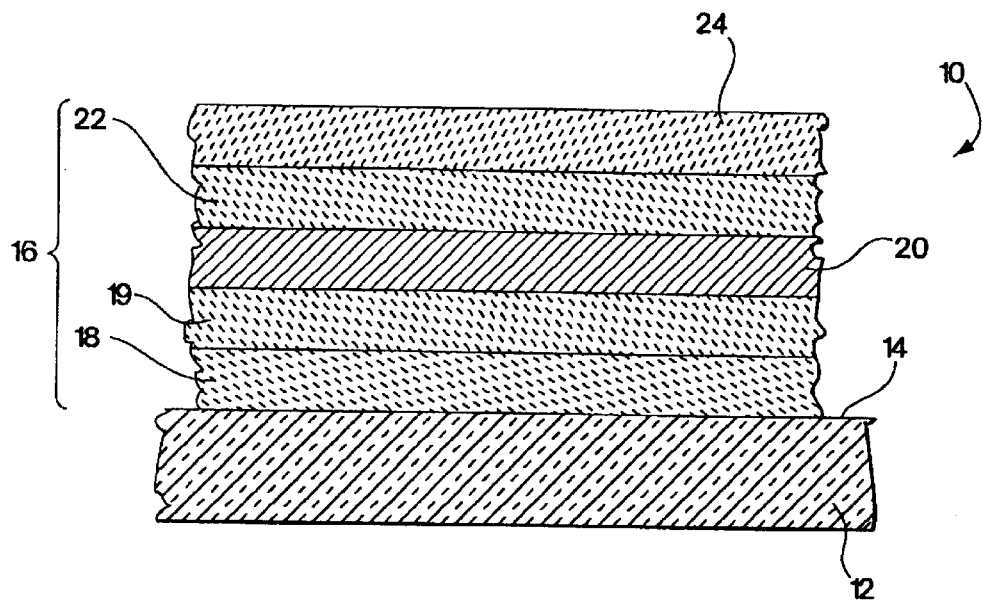
FIG. 1 is a schematic cross-sectional view of a coated article of manufacture according to a first preferred embodiment.
Figure 2:
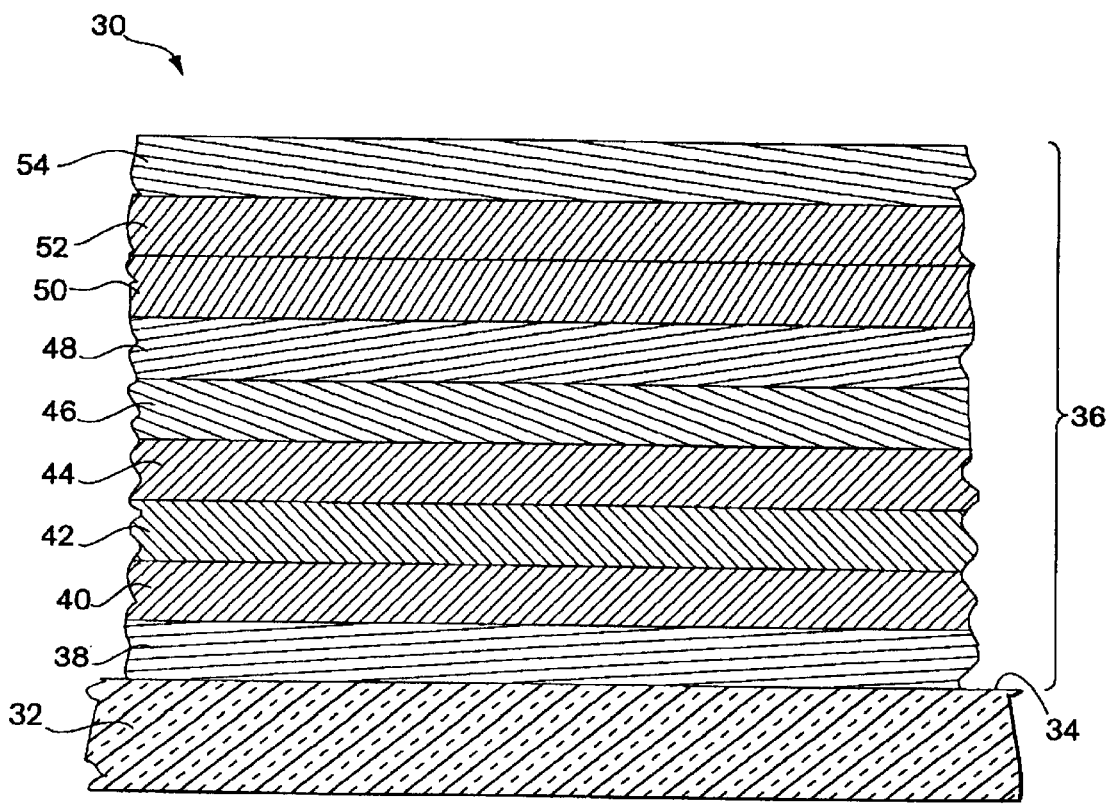
FIG. 2 is a schematic cross-sectional view of a second preferred embodiment.
Figure 3:
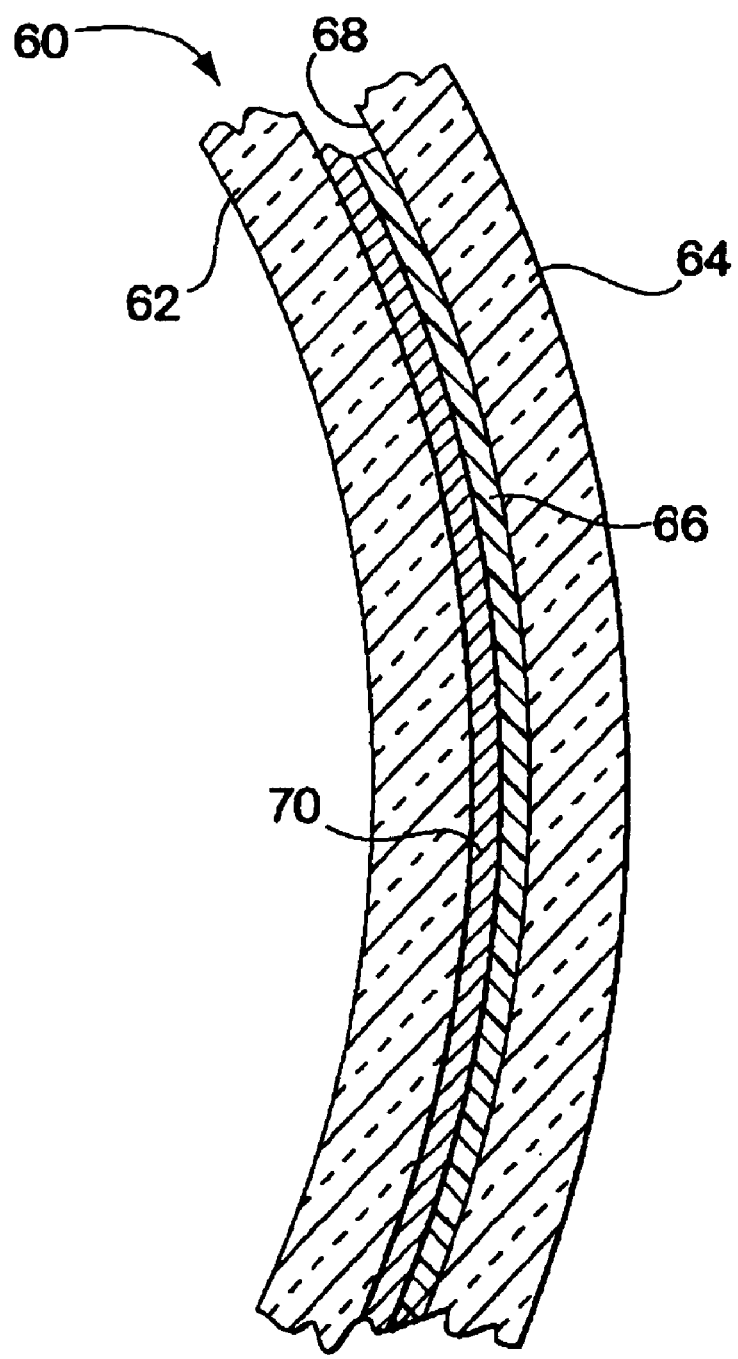
FIG. 3 is a schematic illustration of a motor vehicle windshield (partially broken away) in accordance with a preferred embodiment, having the coating of FIG. 2 on surface No. 2 of the glazing panes.

It should be understood that the schematic illustrations in FIGS. 1–3 are not necessarily to scale. In particular, the thickness of the various individual layers forming the substantially transparent multi-function coating are increased relative the thickness of the substrate for the purpose of clarity and ease of illustration.

DETAILED DESCRIPTION OF CERTAIN PREFERRED EMBODIMENTS

The coatings disclosed here are thermostable in that, when subjected to thermal stress, they are resistant, against degradation, most notably in their capacity to block or transmit light. In addition, the term "thermostable" refers to a coating or coated article of manufacture which substantially retains its characteristic mechanical properties, such as body integrity, surface continuity, tensile strength and adhesiveness (e.g., between coating and substrate). The term "thermal stress" is herein taken to mean the stresses encountered upon exposure to high temperatures used for heat treatment, e.g., for tempering or bending the glazing substrate. Typically, such temperatures are in the range of 590° C. to 650° C. The solar coatings of the invention are thermostable at the tempering temperature of the glazing substrate and/or at its bending temperature.

It will be apparent to those skilled in the art, given the above disclosure and the following detailed description, that the coated articles disclosed here, comprising a substantially transparent glass substrate carrying a substantially transparent coating have numerous commercially significant applications. For ease of discussion, the following detailed description of certain preferred embodiments will focus primarily on articles suitable for automotive or architectural glazing applications. It will be within the ability of those skilled in the art, given the above disclosure and this detailed description, to employ the invention in alternative applications.

Referring now to FIG. 1, a coated article 10 is seen to comprise a substantially transparent substrate 12 having a main surface 14 carrying substantially transparent, multi-layer coating 16. In preferred embodiments, the substantially transparent substrate is a flat or curvo-planer pane of glass or glass ceramic. It is highly preferred that the substantially transparent substrate be a panel of glass selected from the group consisting of soda-lime-silica glass, borosilicate glass, aluminosilicate glass, vycor, fused silica and vitreous silica. It is particularly preferred that the glass be soda-lime-silica glass. Coating 16 provides thermal insulation or anti-solar performance characteristics for the coated article. Coating 16 includes a first anti-reflection layer 18 directly on the surface 14. Numerous suitable materials for anti-reflection layer 18 are disclosed above and will be apparent to those skilled in the art given the benefit of this disclosure. Most preferably anti-reflection layer 18 is formed of $SnO_2$. It should be understood that all references here and in the appended claims to an oxide, unless otherwise clear the context of any particular instance of its use, are intended to include variations in the degree of oxidation. Chromium buffer layer 19 lies directly on anti-reflection layer 18. Silver metal layer 20 lies directly on buffer layer 19. Second buffer layer 22 directly overlies silver metal layer 20. The overlying anti-reflection film 24 is exposed to the atmosphere. It will be within the ability of those skilled in the art, given the benefit of this disclosure, to determine suitable thickness for the individual layers of coating 16, given the benefit of the disclosure, including suitable thickness for silver metal layer 20 adapted to the intended application of the coated article. Silver metal layers of greater thickness will provide enhanced infra-red reflectivity, while thinner silver metal layers will provide increased transmittance of light in the visible wavelength range. In accordance with certain preferred embodiments, the silver metal layer has a thickness between 6 nm and 18 mm, more preferably between 8 nm and 12 nm for automotive applications and between 8 nm and 16 nm for architectural applications.

It will be within the ability of those skilled in the art, given the benefit of this disclosure, to employ additional coatings or additional coating layers with the multi-layer, heat-treatable, thermal insulation coatings disclosed here. For example, transparent oxide or nitrite over-layers may be used at the surface of the coating exposed to the atmosphere. Also, colour control layer(s) can be used, preferably at the interface of the coating with the glass substrate or on a different surface of the glass substrate. One or more other additional coatings may be used, e.g., an all-dielectric anti-reflecting coating system on a different surface of the glass substrate, preferably on the number 4 surface of a double pane (interior side). Such AR coating improves the visible transmittance of the overall coated article. Also, adhesion enhancing layer(s) can be used, e.g., at the interface of the coating with the glass substrate or on a different surface of the glass substrate.

The adhesion increasing layer or colour forming layer preferably has a thickness less than 50 Å and is formed preferably of silicon or tungsten metal. It will be within the ability of those skilled in the art, given the benefit of this disclosure, to select a suitable material and thickness for the colour control layer to achieve both enhanced uniformity and desired hue or colour of the coated article. Reference here to uniformity of colour refers to reduction in blotchiness or the like which may otherwise appear in a coated article An alternative preferred embodiment of the coated articles disclosed here is illustrated in FIG. 2, having a substantially transparent soda-lime-silica glass substrate 32. A substantially transparent, heat-treatable coating 36 is carried on surface 34 of substrate 32. In coating 36, first anti-reflection layer 38 directly over the surface 34 of substrate 32.

The anti-reflection layer 38 in coating 36 of coated article 30 is comparable to anti-reflection layer 18 in the embodiment of FIG. 1. Directly overlying anti-reflection layer 38 is a first buffer layer 40, preferably a chromium buffer layer, for the reasons discussed above. Silver metal layer 42 in the embodiment of FIG. 2 corresponds generally to silver metal layer 20 in the embodiment of FIG. 1. Similarly, second buffer layer 44 corresponds generally to buffer layer 22 in the embodiment of FIG. 1. It will be within the ability of those skilled in the art to select a suitable thickness for buffer layer 40, in conjunction with selection of the thickness of buffer layer 44, to provide good protection for the silver metal layer 42 and the other layers of coating 36 within the constraints of meeting spectral performance requirements in the finished article. Oxide layer 46 directly overlies record buffer layer 44, and may be deposited in two parts. Specifically, if a double pass sputtering deposition is carried out as disclosed above, a first portion of oxide layer 46 may be deposited at the last deposition station during the first pass of the glass substrate through the sputtering chamber. The second portion would then be deposited at the first deposition station during the final pass. Third buffer layer 48 directly overlies oxide layer 46. Second IR reflection layer 50 directly overlies third buffer layer 48. Fourth buffer layer 52 directly overlies silver metal layer 50. Outer anti-reflective layer 54 directly overlies fourth buffer layer 52, and is exposed to the atmosphere or to the space between pane 32 and a second, coated or uncoated pane used with pane 32 to form a double-glazed unit. Such space between two panes can be a vacuum or filled with inert gas. The coated surface also can be positioned to lie against a PVB laminating sheet in a windshield construction or the like. Anti-reflection film 54 in the embodiment of FIG. 2 corresponds generally to tin oxide or other oxide anti-reflection layer 24 in the embodiment of FIG. 1. The thickness of the outer anti-reflection layer, that is, anti-reflection layer 24 in FIG. 1 and 44 in FIG. 2, is selected to provide, in conjunction with the other layers of the coating, suitably low reflectance of visible light, with reflectance color preferably being neutral or grey-blue in the unheat-treated condition.

In accordance with certain preferred embodiments, the coated article 30 is subjected to a tempering step subsequent to deposition of the coating 36. Coating 36 survives exposure to the high temperatures required for tempering a glass substrate, such as a soda-lime-silica glass substrate intended for architectural or automotive applications.

FIG. 3 illustrates a motor vehicle windshield partially broken away, in accordance with a preferred embodiment. A first pane 62 is laminated to a record sheet 64 by PVC sheet 66 between them. The inside pane 62, i.e., the one toward the motor vehicle passenger compartment, was bent in tandem with outer pane 64 and then separated for laminating. A heat-treatable, multi-layer coating 70, in accordance with the present disclosure is on surface No. 2 of the windshield, i.e., inside surface 68 of outside pane 64. Preferably coating 70 is in accordance with the coating shown in FIG. 1 or FIG. 2. Above figure showing two panes of glass window, withe the temperable multi functioning coating on the No. 2 surface is necessary here.

The heating temperature/time profile of the bending furnace or lehr used for bending a heat-treatable coated glazing of the present invention is important. Suitable lehrs include, for example, a Tamglass bending furnace for simultaneous shaping of the two panes of an automobile windshield by gravity sag forming. The top pane preferably is coating free and the inside of the lower pane comprises the coating. Such bending furnace has five thermal zones. A first heating zone is from room temperature to 350° C. A second heating zone is from 350° C. to 620° C. A third heating zone is the bending zone and the last two zones are the cooling regions where glass cool downs slowly at first and then faster. The total time of the bending process is typically about 30 minutes: 15 min. for heating & bending and 15 min. for cooling. The best results of bending in the third zone occur for typical automotive soda-lime-silica glass, at about 615° C. over 45 to 60 seconds. It will be within the ability of those scheduled in the art to determine alternative suitable temperature/time profiles given the benefit of the present disclosure.

Preferred embodiments of the coated articles disclosed here can be prepared in accordance with various suitable techniques employing commercially available equipment and materials. Preferably, the substantially transparent dual-function coating is formed on the surface of the substantially transparent substrate by cathodic sputtering. In accordance with certain preferred embodiments, a coated article is manufactured by depositing each of the layers of the coating in sequence. Preferably, each of the layers is deposited in turn as the substrate travels continuously through a multi-station sputtering chamber. Thus, in manufacturing the embodiment of FIG. 1, for example, as the substrate passes through a first sputtering station within such multi-station chamber, the first anti-reflection layer of dielectric material is deposited by DC magnetron sputtering onto the surface of the substrate. Depending on the substrate travel speed, deposition parameters, and the thickness of the anti-reflection layer, one, two or more sputtering stations can be used to deposit the same coating material. In this way, one can achieve shorter deposition cycle time. After having deposited the first anti-reflection layer onto the glass surface, the buffer layer and infrared reflective layer are then deposited by sputtering as the substrate passes through a subsequent station of the multi-station chamber. The second buffer layer is deposited at a subsequent station within the chamber, and then the second anti-reflection layer is deposited on a subsequent station. Preferably, the substrate moves continuously through the chamber, such that the individual layers are deposited onto the substrate as it is traveling. The individual stations are sufficiently isolated by curtains or other suitable partition means, such that the reactive atmosphere employed at a first sputtering station does not contaminate the non-reactive atmosphere employed at an adjacent station. In this regard, where less than all stations of a multi-station deposition chamber are to be employed, for example, where an eight-station chamber is to be used to deposit a four-layer coating, a station can be left unused between one employing a reactive atmosphere and another employing a non-reactive atmosphere to achieve better isolation. Suitable multi-station sputter deposition chambers are commercially available, including pilot plant size coaters, for example, Model Z600 from Balzers Process System GmbH, D-63755, Alzenau, Germany, and full commercial scale coaters, for example, Interpane 1993 model Coater available from Interpane Glass Industrie AG, Sohnr Eystasse 2137697 Lauenförde, Germany. Table A gives the typical process parameters for Model Z600 pilot plant coater and for an Interpane 1993 Model production coater.

| Parameters | Z600 | Interpane |
|---|---|---|
| Maximum Substrate Dimensions, cm | 40 × 50 | 600 × 300 |
| Background Pressure, mbar ($10^{-5}$) | 5 | 5 |
| Power Density (Watt/cm$^2$) | 0.2–5 | 0.2–5 |
| Working Pressure, mbar ($10^{-3}$) | 1.5–4 | 2–7 |
| Argon, sccm | sputter | sputter |
| Oxygen, sccm | reactive | reactive |
| Nitrogen, sccm | reactive | reactive |

Advantageously, such preferred multi-station sputtering chambers employ sputter targets which are wider than the glass substrates being coated and are mounted in a direction extending perpendicular to the travel direction of the substrate. It will be within the ability of those skilled in the art to select suitable deposition conditions and parameters for magnetron DC sputtering of the various layers disclosed above for the transparent coated articles of the present invention. The following deposition parameters are suitable for a typical deposition process to produce a heat-treatable, multi-layer coating in accordance with the embodiment of FIG. 1 coating on a soda-lime-silica glass substrate 40 cm wide by 50 cm long traveling at a rate of 2 meters per minute through the sputtering chamber.

1. The sputtering chamber is initially evacuated to about $5\times10^{-5}$ millibar and then raised to an operating pressure of approximately $3\times10^{-3}$ millibar by the injection of operating gases at the various sputtering stations.
2. Tin oxide anti-reflection layers are deposited by sputtering from a pure tin target in an operating atmosphere of $3.2\times10^{-3}$ millibar with an Argon/Oxygen flow rate ratio of 45/82, at a power level of about 4 to 5.5 Watts/cm$^2$. The throw distance from the tin target to the substrate is typically about 5 to 15 cm.
3. The silver infra-red reflective layer is deposited from a pure silver target in a non-reactive atmosphere, for example, a substantially pure argon atmosphere, in an operating atmosphere of $2.0\times10^{-3}$ millibar at a power level of about 0.4 to 2.6 Watts/cm$^2$. The throw distance from the silver target to the substrate is typically about 5 to 15 cm.
4. The chromium buffer layers are deposited from a chromium target in a non-reactive atmosphere, for example, a substantially pure argon atmosphere, in an operating atmosphere of $11\times10^{-4}$ millibar at a power level of about 0.4 to 1.0 Watts/cm$^2$. The throw distance from the silicon target to the substrate is typically about 5 to 15 cm.

In accordance with certain preferred embodiments, a substantially transparent, heat treatable coating in accordance with the structure of the embodiment of FIG. 2 described above is formed by passing the substrate through the multi-station sputtering chamber a first time, followed by passing it through the sputtering chamber a second time. Preferably the deposition characteristics and process parameters are maintained the same before the two passes, such that substantially identical sets of layers are deposited during each pass. Optionally, a slightly thicker final oxide layer is deposited for enhanced performance characteristics. In general, it would be understood that the thickness of the deposited layers will be determined largely by the deposition power level, working gas conditions, and the exposure time. The exposure time is determined primarily by the speed at which the substrate is traveling through the sputtering chamber, although additional thickness can be achieved by employing multiple targets for a deposited layer. Throw distance is also a significant factor in determining layer thickness. In preferred embodiments employing sputtering targets wider than the substrate, advantageously small throw distances can be used without sacrificing uniformity of deposition thickness.

It has been found that, generally, multi-pane glazing systems employing the heat-treatable coating of the present invention provide best results when the coating is placed at the second surface as illustrated in FIG. 3.

The present invention is further disclosed by the following examples, which are intended for purposes of illustration and not limitation.

EXAMPLES

The following examples illustrate coated articles according to the invention, and their manufacture. In each of the following examples, a soda-lime-silica glass panel 30 cm wide by 30 cm long by 6 mm thick is passed through a multi-station sputtering chamber, Model Z600 available from Balzers Process System. At the same time, for visual inspection, measurement and characterizations, test pieces also were coated in the system. That is, same, a 5 cm wide by 5 cm long by 2.2 mm thick glass was used for windshield applications and the same size test pieces of 6 mm thick samples for architectural applications. The glass panel traveled in each case through the sputtering chamber at a travel speed of 2 meters per minute. Immediately prior to entering the sputtering chamber, the glass panel surface to be coated was washed with demineralized water (max 5 microsiemens) and substantially dried by pressurized air. For each of the examples, the sputtering conditions are provided for each layer of the dual-function coating. In those of the examples involving a double-layer structure, as disclosed above, the deposition conditions and parameters were identical for the first and second passes unless otherwise stated.

The spectral properties were measured for the resultant coated article of each example. Perkin Elmer Model Lambda 900 UV Vis NIR spectrophotometer was used to measure the optical performance of each sample, e.g., transmittance, T %, reflectance from film side, R %, and reflectance from glass side, R'%, with all spectra being measured over the 350 nm–2100 nm spectral region. Reference herein to spectral properties in the IR range mean 750 nm to 2100 nm. The weighted spectral averages of the visible region, $T_{vis}$, $R_{vis}$, $R'_{vis}$ and other performance and color information shown in Tables 1–6 were determined by the "Window 4.0", and Uwinter and Usummer were calculated using the "Window 4.1" calculation program both publicly available from the USA Department of Energy. These "U" values are a measure of overall conductance of the thermal energy in terms of Watt/m$^2$ K, calculated using the following table:

| Name | | Outside Temp (° C.) | Inside Temp (° C.) | Wind Speed (m/s) | Wind Direction | Direct Solar (W/m²) | $T_{sky}$ (° C.) | $E_{sky}$ |
|---|---|---|---|---|---|---|---|---|
| Uwinter | Uvalue | −17.8 | 21.1 | 6.7 | 0 Windward | 0.0 | −17.8 | 1.00 |
|  | Solar | −17.8 | 21.1 | 6.7 | 0 Windward | 0.0 | −17.8 | 1.00 |
| Usummer | Uvalue | 31.7 | 23.9 | 3.4 | 0 Windward | 783.0 | 31.7 | 1.00 |
|  | Solar | 31.7 | 23.9 | 3.4 | 0 Windward | 783.0 | 31.7 | 1.00 |

In addition, the $R_s$ surface resistance was measured by a Signatron four probe, and emissivity, e was measured by an IR spectrometer and calculated from the following equation:

$$e = 1 - (1/((1+0.0053) \times R_s))^2$$

Ref.: K. L. Chopra, S. Major, D. K. Pandya. It was found that measured and calculated values fit well with each other for the films having surface resistance $R_s$ less than 10 Omhs. The shading coefficient, sc, was calculated as the performance ratio, $T_{vis}/T_{solar}$, was used to determine the quality of the coatings. The theoretical limit of the $T_{vis}/T_{total}$ solar ratio is 2.15.

EXAMPLE 1

This example shows the properties of a bendable and otherwise heat treatable coated glass suitable for motor vehicle windshield applications. In Table 1 below, the coated glass of this example is identified by reference No. 1345. The same glass following heat treatment as described below is identified in Table 1 as Sample No. t1345. The same sample following such heat treatment and then lamination to an uncoated but otherwise substantially identical glass pane by means of a PVB polymer layer sandwiched between the two glass panes is identified by reference number L1345. The sample of this example is a single silver/single pass sample. That is, the glass is passed through the DC magnetron sputtering chamber only once (hence, being referred to as a single pass coating) wherein it is coated, in order, with an anti-reflection layer, chromium buffer layer, silver layer, second chromium buffer layer and finally second anti-reflection layer. Thus, the coated glass sample of this example has only a single layer of silver in the film stack which makes up the coating deposited on the glass in the sputtering chamber.

The glass panel was prepared and passed through the multi-station sputtering chamber as described above. In this example, the heat-treatable multi-layer coating was $SnO_2/Cr/A_g/Cr/SnO_2$ where the first $SnO_2$ layer (directly on the glass substrate surface) and the topmost $SnO_2$ layer have the same thickness, but the first Cr layer is thinner than the second Cr film. The total thickness of the coating was around 920 Å.

At station 1 within the multi-station sputtering chamber, a 39 nm thick layer of $SnO_2$ was deposited by sputtering from a tin target at 5.1 Watts/cm² in an atmosphere of Argon and Oxygen gasses with the flow ratio of 45 to 82 sccm (i.e., with Argon and Oxygen flow rates of 45 sccm and 82 sccm, respectively) at a vacuum level of $3.2 \times 10^{-3}$ mbar.

At station 2, within the multi-station sputtering chamber, a 2 nm thick layer of Cr was deposited by sputtering from a chromium target at 0.4 Watts/cm² in an atmosphere of Argon gas with a flow rate of 20 sccm at a vacuum level of $11 \times 10^{-4}$ mbar. At station 3, within the multi-station sputtering chamber, a 95 nm thick layer of Ag was deposited by sputtering from a Silver (Ag) target at 1.3 Watts/cm² in an atmosphere of Argon gas with a flow rate of 50 sccm at a vacuum level of $2.0 \times 10^{-3}$ mbar.

At station 4, within the multi-station sputtering chamber, a 2.5 nm thick layer of Cr was deposited by sputtering from a chromium target at 0.4 Watts/cm² in an atmosphere of Argon gas with the flow rate of 30 sccm at a vacuum level of $11 \times 10^{-4}$ mbar.

At station 5, within the multi-station sputtering chamber, a 39 nm thick layer of $SnO_2$ was deposited by sputtering from a tin target at 5.1 Watts/cm² in an atmosphere of Argon and Oxygen gasses with a flow rate of 45 to 82 sccm at a vacuum level of $3.2 \times 10^{-3}$ mbar.

Figure 4A:
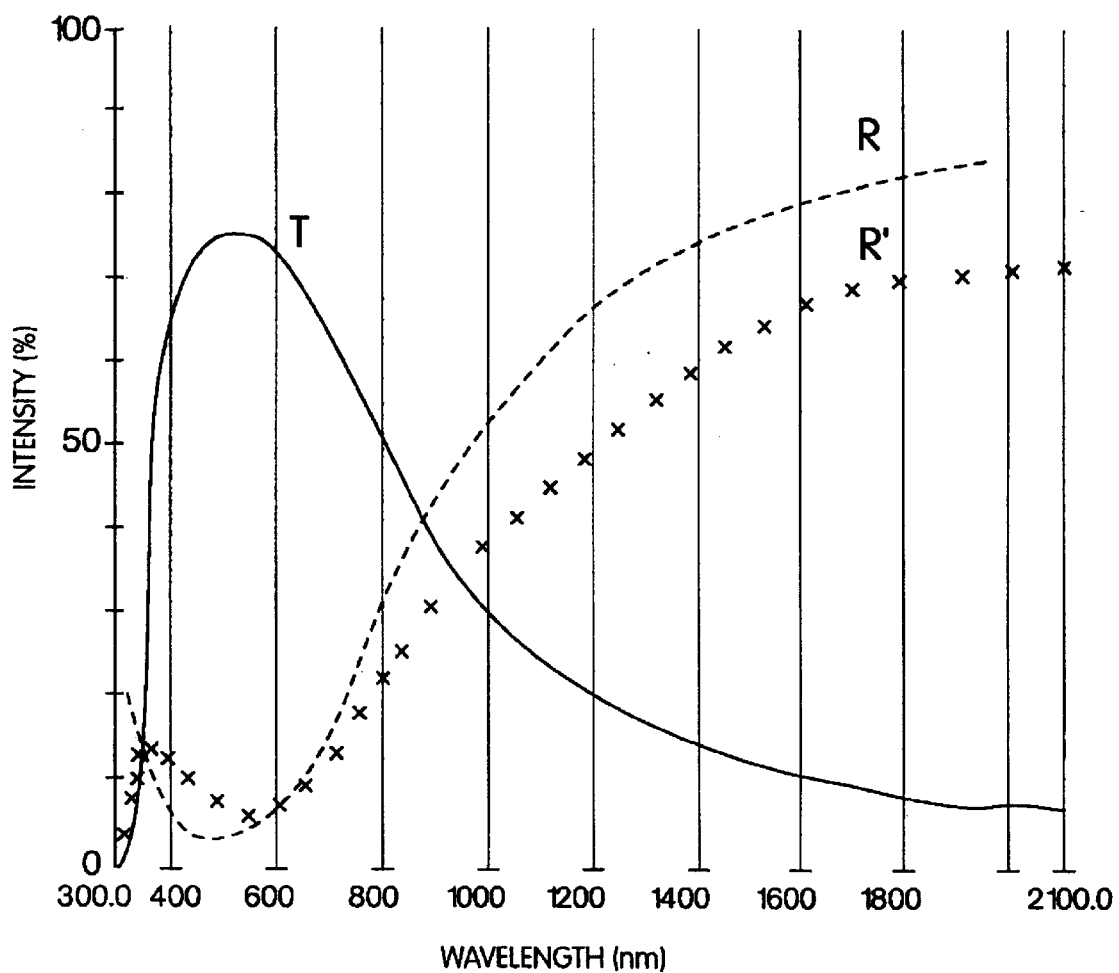
FIGS. 4–7 are graphical representations of the spectral properties of various preferred embodiments described in Examples 1–3, respectively.
Figure 4B:
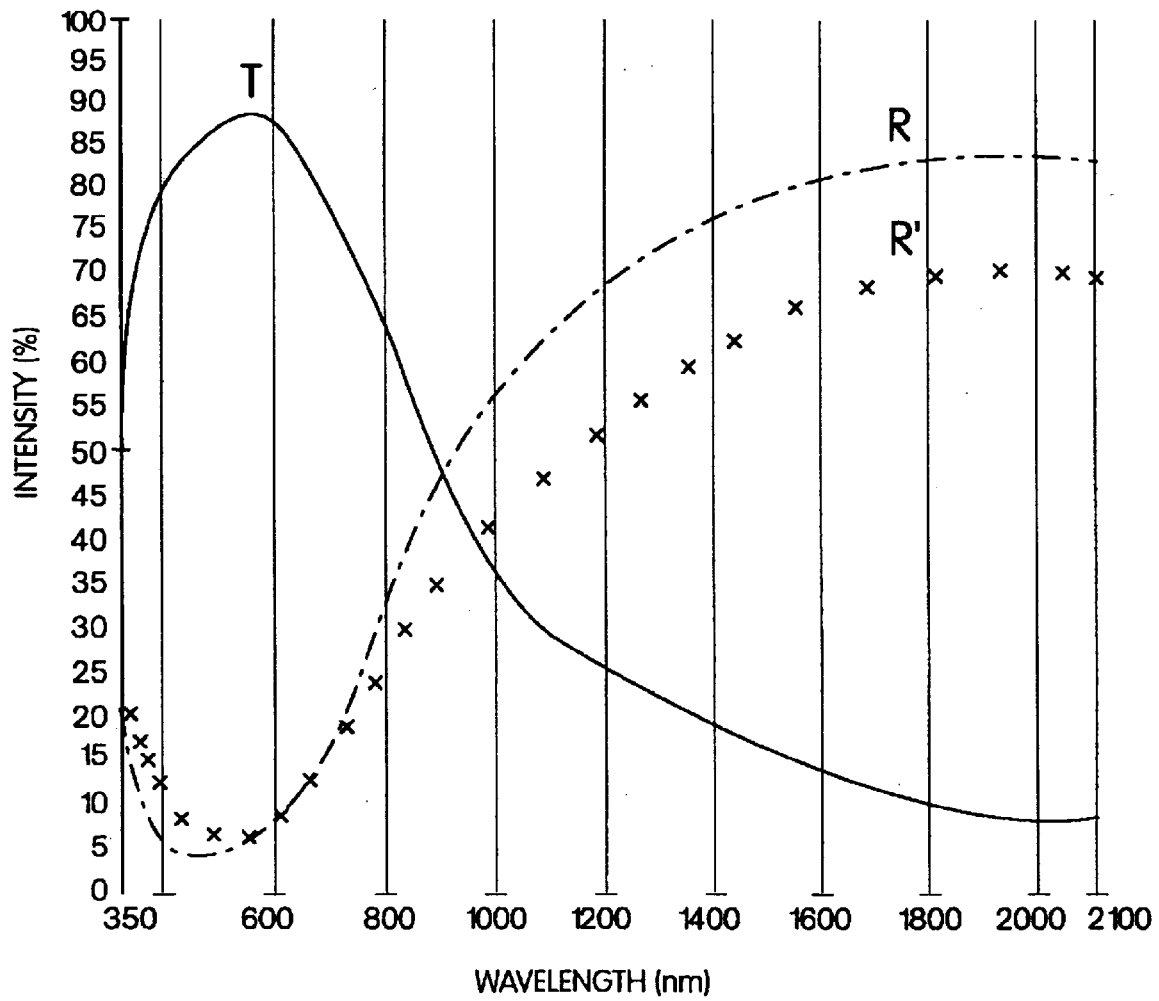
Figure 4C:
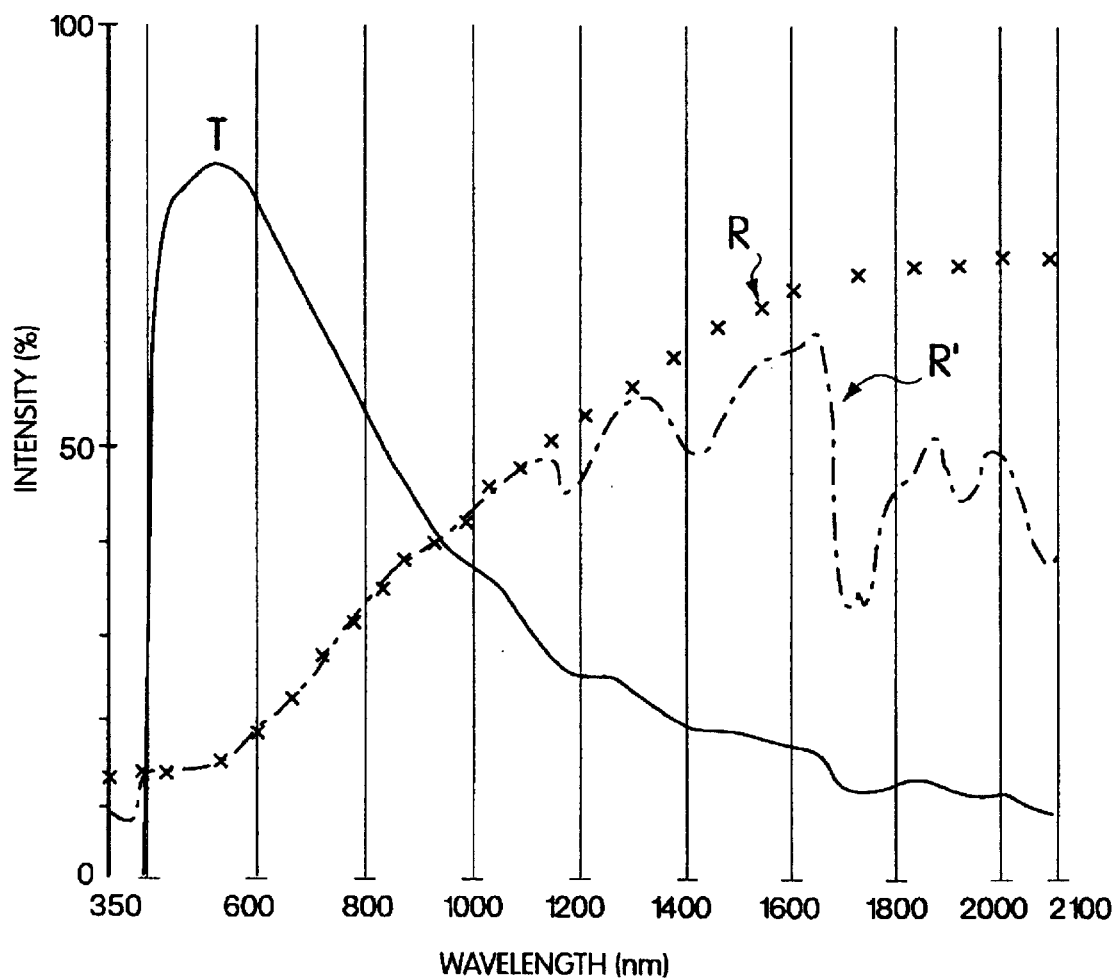

The resultant coated glass panel, Sample No. 1345, had good color uniformity. Its spectral properties are shown in Table 1 below, and spectral transmittance and reflection properties of the coated panel of this Example 1 are shown in the graphs of FIG. 4, wherein the horizontal axis shows wavelength and the vertical axis shows level of transmittance. Specifically, FIG. 4a shows intensity as a function of wavelength for Sample No. 1345, that is, the coating as deposited. FIG. 4b shows corresponding spectral properties for Sample No. t1345, that is, the coating after heat treatment at 635° C. for 1 minute. FIG. 4c shows the spectral properties for Sample No. L1345, that is, the laminated glazing system incorporating the glazing pane carrying the heat-treated coating and laminated by means of a PVB lamination layer to a second, uncoated glazing pane. In all cases, the spectral properties include transmittance (T %), reflection measured from the coated side (R %), and reflection measured from the uncoated side (R'%). As noted above, coated articles of these examples were characterized by spectrophotometric measurements (Perkin Elmer Lambda 900 UV/VIS/NIR Spectrometer), resistance measurements (signatone four probes Model SYS 301 instrument combined with Keithly Model 224 current source and Model 2000 multimeter), and thickness measurements (Tencor Alpha Step Model 500). Film thicknesses were measured by a Tencor Model Alpha step 500 thickness measuring apparatus. Mechanical properties of the samples were determined by a Taber Abraser machine. Environmental stability of the samples were evaluated by using a weathering cabin controlling ambient temperature and humidity. Spectrophotometric measurements were taken over 300 nm to 2100 nm spectral region, including transmittance T %, reflection R % measured from the coated side, and reflection R'% measured from the glass (uncoated) side. As can be seen from Table 1 and the graphs of FIG. 4, the coated panel prepared in accordance with this Example 1 has excellent transmittance of visible light together with good anti-solar properties. In addition, it has excellent environmental properties and long shelf life, specifically, passing a test of at least two weeks in the humidity chamber at 60° C. and 95% relative humidity with substantially no degradation observed throughout the sample surface of 40 cm by 50 cm, including the edges of the laminated product Sample No. 1345. Furthermore, the coating process can be seen from the description here to be fast and economical, so as to be commercially suitable for producing automotive and architectural glazing products. In that regard, the sputter deposition process required only approximately 2.5 minutes.

EXAMPLE 2

Figure 5A:
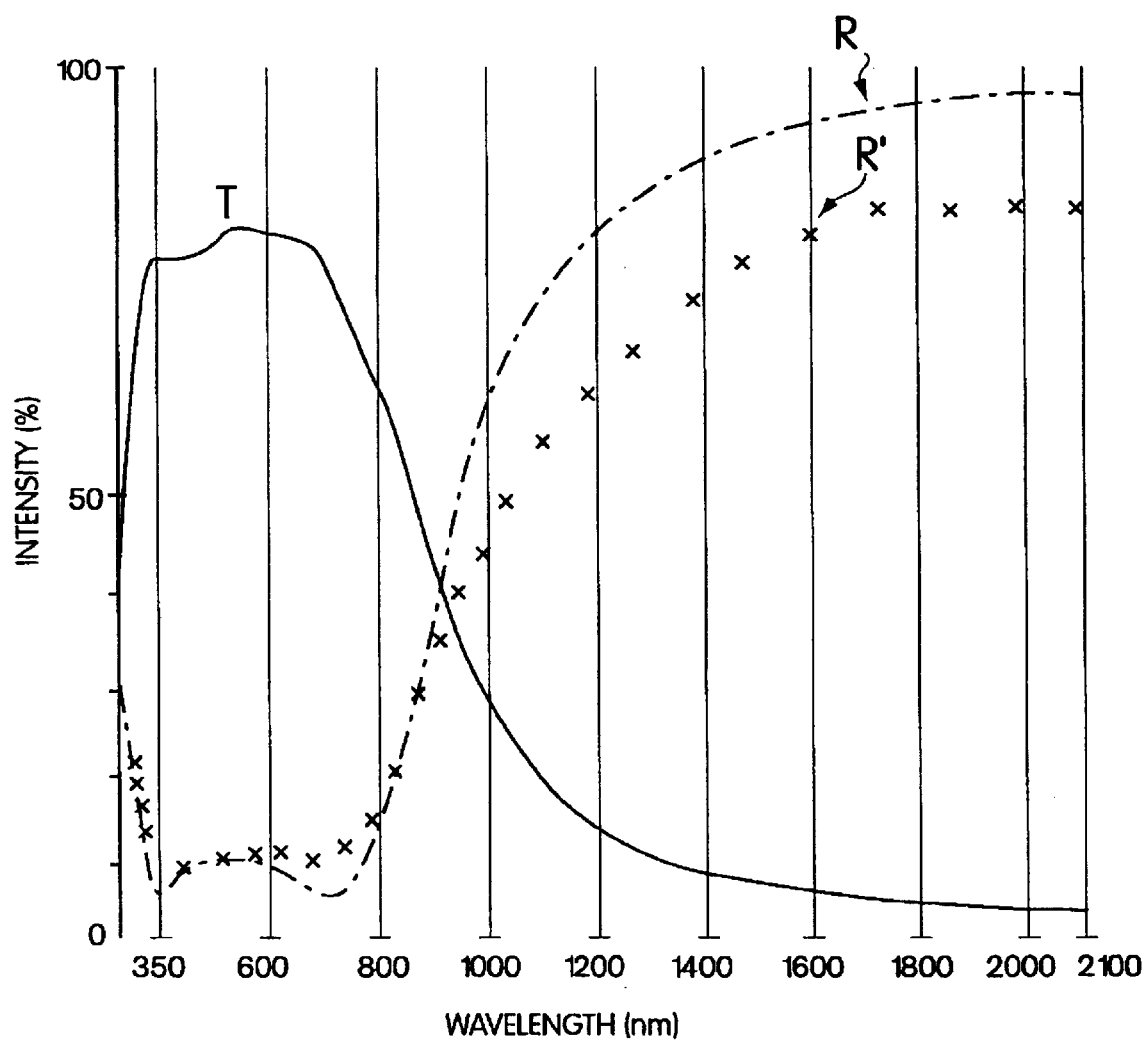
Figure 5B:
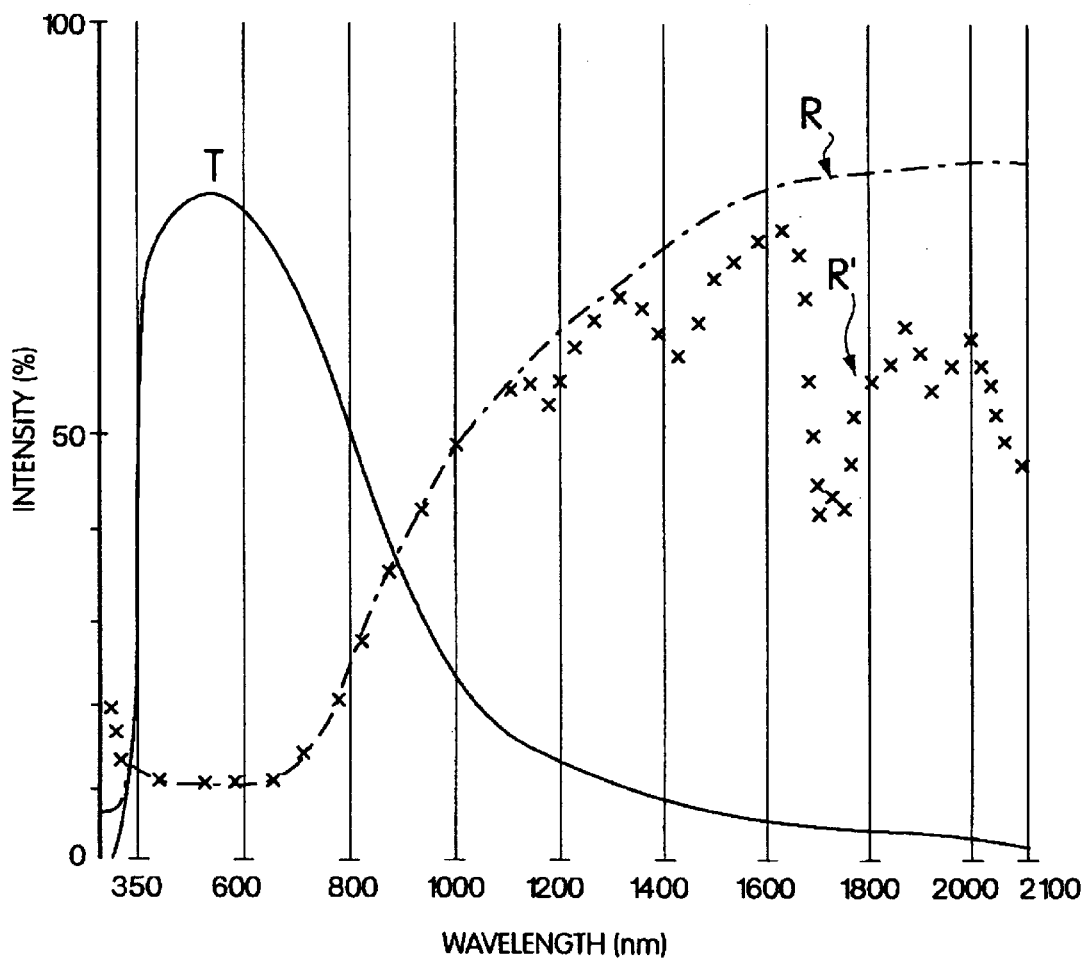

This example illustrates a double pass/double silver layer coating system. That is, in this example, the soda-lime silica glass pane is passed through the DC magnetron sputtering chamber substantially as in Example 1 above, but is then passed through the DC magnetron sputtering chamber a second time to produce a double-layer coating. The resultant coating system deposited onto the glass surface has two IR reflective layers, that is, two layers of silver in the film stack which forms the coating. It will be appreciated from the foregoing disclosure and discussion of the invention, that single pass, single silver layer systems are advantageous in that they are simpler to produce, and are suitable for both automotive and architectural applications. Double pass, double silver layer coating systems, however, in accordance with the invention, also provide excellent spectral properties, environmental durability, etc. In accordance with this Example 2, the glass panel was prepared and passed through the multi-station sputtering chamber as described above in Example 1, except coating was doubled, that is, a coating system of $SnO2/Cr/A_g/Cr/SnO_2/Cr/Ag/Cr/SnO_2$ system was deposited with the respective thicknesses (measured in nanometers) of 40/2/7/2/80/2/7/2/40. The total thickness of the resultant coating was around 182 nm. As mentioned above, in this example the coating was produced by passing the glass panel twice through the coater. The same deposition parameters were maintained during the second pass. The coated sample of this Example 2 was subjected to heat treatment as in Example 1. The resulting heat treated sample is identified in table 1 below by reference No. t1288. The corresponding sample after being laminated to an uncoated but otherwise substantially identical pane by means of a PVB laminating layer is identified in Table 1 below by Reference No. L1288. The spectral properties of Sample No. t1288 and Sample No. L1288 are shown in Table 1 below. Spectral transmittance and reflectance properties of the coated panel of Example 2 are shown in the graphs of FIG. 5a and 5b. Specifically, FIG. 5a shows the spectral properties T, R and R' as intensity (%) as a function of wavelength for Sample No. t1288. FIG. 5b shows the corresponding spectral properties for the laminated Sample No. L1288. Performance values for Sample No. t1288 and Sample No. L1288 also are given in Table 1, below. The samples of this Example 2 were found to have excellent environmental properties and a long shelf life comparable to those of Example 1. More specifically, as can be seen from Table 2 and the graph of FIG. 5, the coated panel prepared in accordance with this Example 2 has excellent transmittance of visible light together with good anti-solar properties. In addition, it has excellent mechanical properties, including long shelf life. Furthermore, the coating process can be seen from the description here to be fast and economical, so as to be commercially suitable for producing automotive and architectural glazing products.

EXAMPLE 3

Figure 6A:
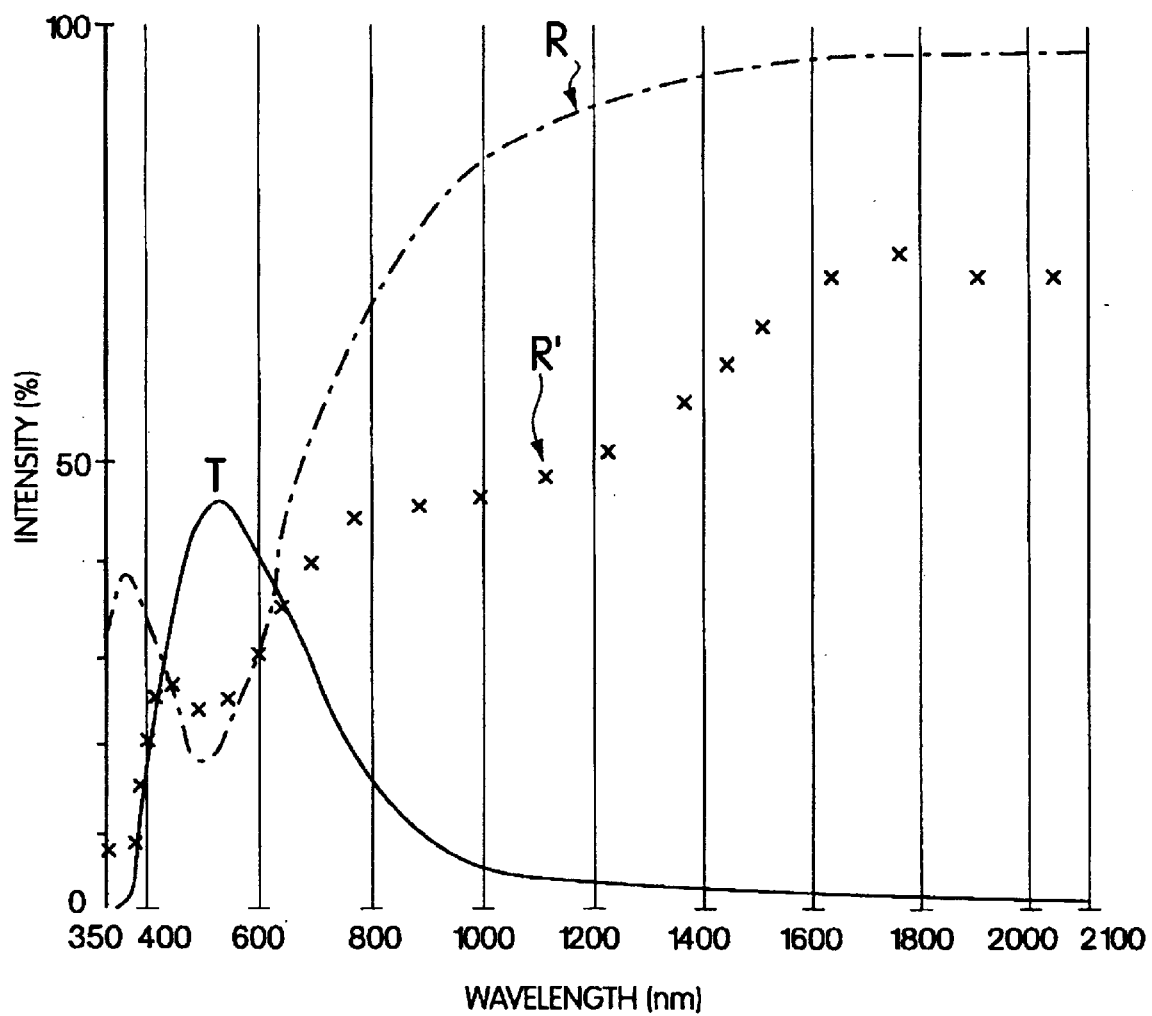
Figure 6B:
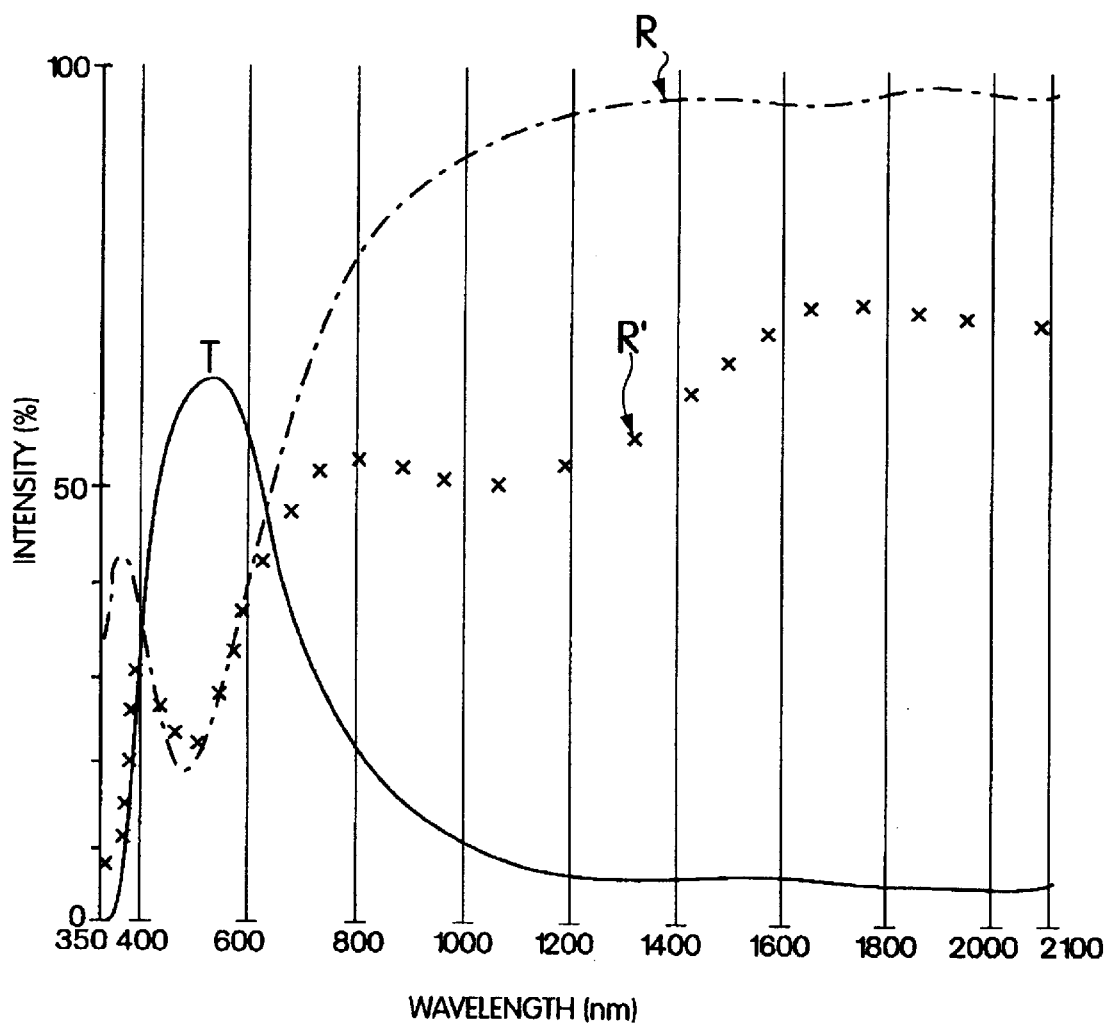

Addition examples of the present invention were prepared to show architectural applications. Specifically, sheets or panes of soda-lime-silica glass having the same composition as in Examples 1 and 2, being 6 mm thick, were used to prepare four architectural glass glazing products. In each case, a first 6 mm pane coated as described below was spaced 12 mm from a second, uncoated 6 mm thick pane. The coating was carried on surface No. 2 of the resultant double pane architectural glazing product. In all four samples, the coating system was deposited under the same conditions recited above in Example 1 except as follows. In the first sample, Sample No. t1372 IG, the chromium and silver layers were thicker than in Example 1. Specifically, the silver layer was 14 nm thick and the two chromium layers, which sandwich the silver layer between them, were each 4 nm thick. The tin oxide layers each was 22 nm thick. The spectral properties of the resulting Sample No. 1372 (tested as a single pane corresponding to the test of Sample 1345 shown in FIG. 4a) carrying the coating system $SnO_2/Cr/Ag/Cr/SnO_2$ are shown in FIG. 6a. Specifically, spectral values T, R and R' are shown in FIG. 6a as a function of wavelength. In FIG. 6b the corresponding spectral properties for the same sample after heat treatment are shown. The heat treatment was the same as that for Example 1. Additional performance characteristics of the heat treated Sample t1372 are shown in Table 1, below.

A series of additional samples in accordance with this Example 3 were prepared, having the same chromium and silver film thicknesses as for the first Sample No. 1372, above. Specifically, each of these additional samples was prepared in accordance with the method of Example 1, having 4 nm thick (before heat treatment) chromium layers sandwiching between them a 14 nm thick silver layer. The thickness of the tin oxide layers of these additional samples was varied. More specifically, the samples were prepared, each carrying a coating system of $SnO_2/Cr/Ag/Cr/SnO_2$ on 6 mm thick glass, wherein each of the two tin oxide layers for the sample had the thickness given below.

| Sample No. | Thickness of $SnO_2$ Layers |
|---|---|
| t1372 | 22 nm |
| t1376 | 35 nm |
| t1378 | 55 nm |
| t1377 | 65 nm |

Figure 7:
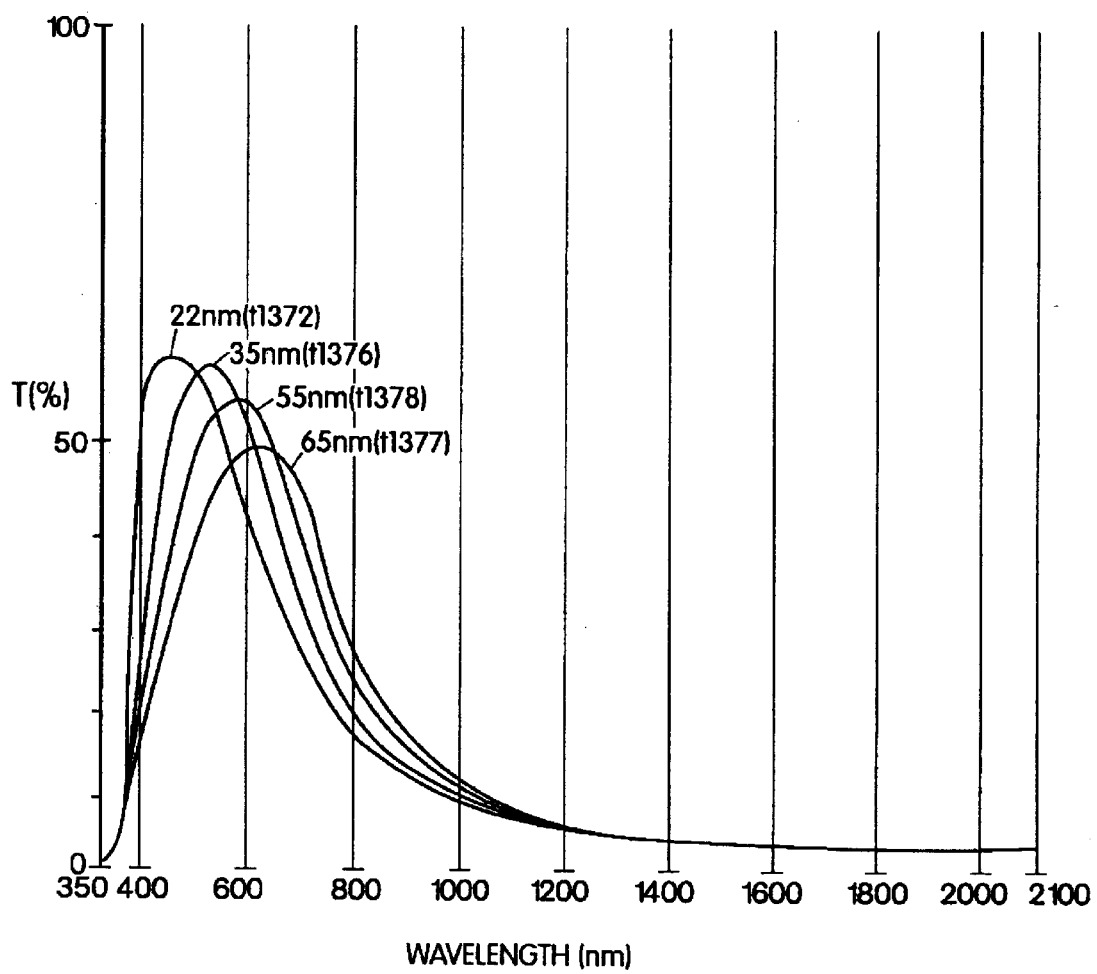

In each case, the thickness recited above is for each of the tin oxide layers, rather than for the two tin oxide layers combined. FIG. 7 shows the transmission spectra for these four samples. As seen there, as the oxide layer thicknesses increase, the transmission maxima or color shifts from blue toward yellow. The same color shifts are observed for reflectance. Additional performance properties for these samples are provided in Table 1, below. It should be noted that the transmission spectra shown in FIG. 7 are for each of the samples following heat treatment as described for the sample of Claim 1, at 650° C. As noted above, the performance characteristics provided in Table 1 below are for each of the samples used in a "6+12+6" double glazing product, that is, a double glazing wherein a first 6 mm pane carrying the respective coating for that sample is paired with a second 6 mm, uncoated pane with a distance of 12 mm between the two panes. Excellent mechanical properties, including long shelf life are obtained for the heat treated samples and for the double pane glazing products made using the coated samples of this example.

TABLE 1

PERFORMANCE TABLE FOR MULTI-FUNCTIONAL GLAZING SYSTEM

| System Descr. | Visible Region Trans. Tvis | Visible Region Reflection Out R1 | Visible Region Reflection In R4 | Sol. Energy Region Trans. Tsol | Sol. Energy Region Reflection Out R1 | Sol. Energy Region Reflection In R4 | Therm. Prop. Winter U win | Therm. Prop. Summer U sum | Shading Coef SCc | Solar Factor SHG- Ce | Relat. Heat Gain RHG | Color Coordinates Transmittance TL | Color Coordinates Transmittance a* | Color Coordinates Transmittance b* | Color Coordinates Reflectance (Out) RL | Color Coordinates Reflectance (Out) a* | Color Coordinates Reflectance (Out) b* |
|---|---|---|---|---|---|---|---|---|---|---|---|---|---|---|---|---|---|
| AUTOMOTIVE GLAZING | | | | | | | | | | | | | | | | | |
| 1345 | 0.74 | 0.06 | 0.05 | 0.47 | 0.26 | 0.32 | 6.20 | 5.99 | 0.63 | 0.54 | 445 | 88.8 | −3.20 | 0.38 | 29.3 | 7.34 | −9.10 |
| t1345 | 0.84 | 0.06 | 0.05 | 0.54 | 0.27 | 0.31 | 6.36 | 6.05 | 0.69 | 0.59 | 483 | 93.2 | −2.20 | 2.64 | 29.6 | 5.23 | −9.30 |
| L1345 | 0.76 | 0.12 | 0.12 | 0.48 | 0.29 | 0.26 | 6.24 | 5.98 | 0.63 | 0.54 | 444 | 90.1 | −3.70 | 1.96 | 40.5 | 5.94 | 5.89 |
| t1288 | 0.76 | 0.07 | 0.07 | 0.50 | 0.27 | 0.30 | 6.36 | 6.10 | 0.65 | 0.56 | 458 | 89.8 | −0.30 | 1.77 | 31.7 | 3.49 | 1.22 |
| L1288 | 0.75 | 0.07 | 0.07 | 0.44 | 0.29 | 0.26 | 6.20 | 6.00 | 0.60 | 0.51 | 423 | 89.1 | −2.00 | 3.73 | 32.7 | 0.75 | −1.10 |
| ARCHITECTURAL GLAZING | | | | | | | | | | | | | | | | | |
| (6 + 12 + 6) t1372 IG | 0.50 | 0.33 | 0.34 | 0.23 | 0.45 | 0.46 | 1.63 | 1.65 | 0.31 | 0.27 | 211 | 76.6 | −12.00 | −1.60 | 63.2 | 10.30 | 16.10 |
| (6 + 12 + 6) t1376 IG | 0.37 | 0.47 | 0.48 | 0.20 | 0.49 | 0.50 | 1.63 | 1.65 | 0.28 | 0.24 | 188 | 68.6 | −9.80 | −16.00 | 73.1 | 2.64 | 31.70 |
| (6 + 12 + 6) t1377 IG | 0.44 | 0.33 | 0.37 | 0.22 | 0.41 | 0.44 | 1.63 | 1.65 | 0.31 | 0.26 | 206 | 71.5 | −4.60 | 14.90 | 64.1 | 1.35 | −7.80 |
| (6 + 12 + 6) t1378 IG | 0.49 | 0.33 | 0.32 | 0.23 | 0.44 | 0.45 | 1.63 | 1.65 | 0.33 | 0.29 | 236 | 75.3 | −8.50 | 11.00 | 63.8 | 3.59 | −1.00 |

It will be apparent from the foregoing disclosure that alternative embodiments are possible within the scope of the invention, including, for example, modifications to the preferred embodiments described above. It will be recognized by those skilled in the art, given the benefit of the present invention, that coated articles of manufacture in accordance with the present invention can be prepared which are more or less colorless, depending on the thicknesses of the various films employed to form the coating. In particular, increasing the thickness of one or more of the anti-reflection oxide layers and/or decreasing the thickness of the silver infra-red reflective layer can be employed to provide a more colorless sample. This is consistent with the discussion in Example 7, above. Correspondingly, a more color-forming article can be prepared by decreasing the thickness of the anti-reflection layers and increasing the silver layer thickness. Additional alternative embodiments of the present invention, including those employing $SnO_2$ and the like can be employed in accordance with the principles disclosed here to provide color-forming or colorless coated articles within the scope of the present invention.

What is claimed is:

1. A heat-treatable coated glass article comprising a substantially transparent glass substrate with a substantially transparent coating on a surface of the glass substrate, the substantially transparent coating comprising:
    a first anti-reflection layer of dielectric material overlying the glass substrate,
    a first chromium buffer layer overlying the first anti-reflection layer,
    an infra-red reflective layer of metal selected from silver metal, copper metal and a
    mixture of both, directly overlying the first buffer layer,
    a second chromium buffer layer directly overlying the infra-red reflective layer, and
    a second anti-reflection layer of dielectric material overlying the second buffer layer.

2. The coated article of manufacture according to claim 1 wherein the infra-red reflective layer is silver metal and the first and second anti-reflection layers each is $SnO_2$.

3. The heat-treatable coated glass article according to claim 2 wherein the thickness of each chromium buffer layer is 10% to 30% of the thickness of the infra-red reflective layer of silver metal.

4. The heat-treatable coated glass article according to claim 2 wherein the thickness of each chromium buffer layer is 1 nm to 5 nm and the thickness of the infra-red reflective layer of silver metal is 6 nm to 13 nm.

5. The heat-treatable coated glass article according to claim 4 wherein the first and second anti-reflection layers of $SnO_2$ each has a substantially uniform thickness from 20 nm to 50 nm.

6. The heat-treatable coated glass article according to claim 1 wherein said glass is not heat-treated and, when the glass has a thickness of about 2.2 mm to 6 mm, has the following characteristics:
    grey-blue color and substantially free of haze;
    visible transmittance of 40% to 70%; and
    sheet resistance of not more than 7 ohms/sq.

7. The heat-treatable coated glass article according to claim 1 wherein said glass is heat-treated clear glass and, when the glass has a thickness of about 2.5 mm to 6 mm, has the following characteristics after heat-treatment:
    substantially free of haze;
    visible transmittance of 50% to 80%; and
    sheet resistance of not more than 5 ohms/sq.

8. The heat-treatable coated glass article according to claim 1 wherein the first anti-reflection layer lies directly on the surface of the glass.

9. The heat-treatable coated glass article according to claim 8 wherein the first chromium buffer layer lies directly on the first anti-reflection layer.

10. The heat-treatable coated glass article according to claim 9 wherein the infra-red reflective layer directly overlies the first chromium buffer layer.

11. The heat-treatable coated glass article according to claim 10 wherein the second chromium buffer layer directly overlies the infra-red reflective layer.

12. The heat-treatable coated glass article according to claim 11 wherein the second anti-reflection layer directly overlies the second buffer layer.

13. The heat-treatable coated glass article according to claim 1 wherein the substantially transparent glass substrate is soda-lime-silica glass.

14. A heat-treatable coated glass article comprising a substantially transparent glass substrate with a substantially transparent coating on a surface of the glass substrate, the substantially transparent coating comprising:

a first anti-reflection layer of dielectric material overlying the glass substrate, a first buffer layer overlying the first anti-reflection layer, a first infra-red reflective layer of silver metal directly overlying the first buffer layer, a second buffer layer directly overlying the infra-red reflective layer, a second anti-reflection layer of dielectric material overlying the second buffer layer, a third buffer layer overlying the second anti-reflection layer, a second infra-red reflective layer of silver metal directly overlying the third buffer layer, a fourth buffer layer overlying the second infra-red reflective layer of silver metal, and a third anti-reflection layer of dielectric material overlying the fourth buffer layer.

15. The heat-treatable coated glass article of claim 14 wherein each of the anti-reflection layers is $SnO_2$ and the buffer layers each is a chromium buffer layer.

* * * * *